(12) United States Patent
Kim

(10) Patent No.: US 7,776,711 B2
(45) Date of Patent: Aug. 17, 2010

(54) METHOD FOR MANUFACTURING A TRANSISTOR OF A SEMICONDUCTOR MEMORY DEVICE

(75) Inventor: Hyun Jung Kim, Goyang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 111 days.

(21) Appl. No.: 12/331,830

(22) Filed: Dec. 10, 2008

(65) Prior Publication Data

US 2009/0093101 A1 Apr. 9, 2009

Related U.S. Application Data

(62) Division of application No. 11/450,096, filed on Jun. 9, 2006, now Pat. No. 7,479,676.

(30) Foreign Application Priority Data

Sep. 15, 2005 (KR) .......................... 10-2005-86497

(51) Int. Cl.
*H01L 29/82* (2006.01)
*H01L 43/00* (2006.01)

(52) U.S. Cl. ........................ 438/424; 438/427; 438/589; 257/374

(58) Field of Classification Search ................. 438/424, 438/427, 589, 296, 359; 257/374, E27.084, 257/E21.546
See application file for complete search history.

(56) References Cited

U.S. PATENT DOCUMENTS

| | | | |
|---|---|---|---|
| 5,851,916 | A | 12/1998 | Howard |
| 6,215,142 | B1 * | 4/2001 | Lee et al. .................... 257/301 |
| 6,372,605 | B1 | 4/2002 | Kuehne et al. |
| 6,844,231 | B2 | 1/2005 | Kim et al. |
| 6,852,576 | B2 | 2/2005 | Lin et al. |
| 6,962,843 | B2 | 11/2005 | Anderson et al. |
| 7,005,696 | B2 | 2/2006 | Yih et al. |

(Continued)

FOREIGN PATENT DOCUMENTS

KR 0165459 2/1999

(Continued)

*Primary Examiner*—Theresa T Doan
(74) *Attorney, Agent, or Firm*—Marshall, Gerstein & Borun LLP

(57) ABSTRACT

A transistor of a semiconductor memory device including a semiconductor substrate having a plurality of active regions and a device isolation region, a plurality of first and second trench device isolation layers, which are arranged alternately with each other on the device isolation region of the semiconductor substrate, the first trench device isolation layers having a first thickness corresponding to a relatively high step height, and the second trench device isolation layers having a second thickness corresponding to a relatively low step height, a recess region formed in each of the active regions by a predetermined depth to have a stepped profile at a boundary portion thereof, the recess region having a height higher than that of the second trench device isolation layers to have an upwardly protruded portion between adjacent two second trench device isolation layers, a gate insulation layer, and a plurality of gate stacks formed on the gate insulation layer to overlap with the stepped profile of the respective active regions and the protruded portion of the relevant recess region.

7 Claims, 8 Drawing Sheets

U.S. PATENT DOCUMENTS

| | | |
|---|---|---|
| 7,015,099 B2 | 3/2006 | Kim et al. |
| 7,045,846 B2 * | 5/2006 | Jang et al. .................. 257/306 |
| 2006/0118889 A1 | 6/2006 | Suh |
| 2006/0244055 A1 | 11/2006 | Jang et al. |

FOREIGN PATENT DOCUMENTS

| | | |
|---|---|---|
| KR | 102005008330 | 8/2005 |

* cited by examiner

METHOD FOR MANUFACTURING A TRANSISTOR OF A SEMICONDUCTOR MEMORY DEVICE

CROSS-REFERENCE TO RELATED APPLICATIONS

This is a divisional of co-pending, commonly-assigned U.S. application Ser. No. 11/450,096 filed Jun. 9, 2006, which in turn claims the convention priority of Korean application 2005-86497 filed Sep. 15, 2005.

BACKGROUND OF THE INVENTION

1. Field of the Invention

The invention relates generally to a semiconductor memory device and a method for manufacturing the same and, more particularly, to a transistor of a semiconductor memory device and a method for manufacturing the same.

2. Description of the Related Art

The degree of integration of semiconductor memory devices, for example, a dynamic random access memory (DRAM) device, is increasing. Such an increase in the degree of integration causes a variety of problems due to the short channel effect of a transistor that is an element of the semiconductor memory device. As one example of the problems, a general rule that a threshold voltage has no relation to the length or width of a channel is no longer applicable to certain channel structures, in particular, to sub-100 nm channel structures. For this reason, in a conventional transistor having a planar structure it is difficult to obtain a desired threshold voltage. Moreover, it will be easily expected that obtaining the desired threshold voltage becomes more difficult to a sub-50 nm channel structure.

In accordance with the this trend, a variety of transistors having a three-dimensional structure, rather than the planar structure, have been proposed. Examples of three-dimensional transistors include a transistor having a recess channel, and a transistor having a stepped profile. In particular, the transistor having a stepped profile is configured such that the surface of an active region has a stepped profile, and a gate stack is laminated on the stepped profile, thereby achieving an increase in an effective channel length while maintaining a constant area of the transistor.

In addition, one example of transistors, which are mainly used in logic devices rather than memory devices, is a fin field effect transistor (FINFET). The fin field effect transistor is configured such that the surface of an active region partially protrudes to form a fin, and a gate stack is laminated on the fin. The fin field effect transistor having the above described configuration exhibits good On/Off characteristics, high current drive ability, and low back-bias dependency. However, when the fin field effect transistor is employed in a memory device, the fin field effect transistor forms a triple channel in a small region. This results in an increase in a source of leakage current with respect to bonding, and makes it difficult to ensure a sufficient data retention time.

GENERAL DESCRIPTION OF THE INVENTION

The invention provides a transistor of a semiconductor memory device having a structure, which integrates the structure of a transistor having a stepped profile and the structure of a fin field effect transistor, thereby achieving an improvement in operational characteristics and ensuring sufficient data retention time.

The invention also provides a method for manufacturing a transistor of a semiconductor memory device using a damascene process.

In accordance with one aspect, the invention provides a transistor of a semiconductor memory device including: a semiconductor substrate having a plurality of active regions and a device isolation region; a plurality of first and second trench device isolation layers, which are arranged alternately with each other on the device isolation region of the semiconductor substrate, the first trench device isolation layers having a first thickness corresponding to a relatively high step height, and the second trench device isolation layers having a second thickness corresponding to a relatively low step height; a recess region formed in each of the active regions by a predetermined depth to have a stepped profile at a boundary portion thereof, the recess region having a height higher than that of the second trench device isolation layers to have an upwardly protruded portion between adjacent two second trench device isolation layers; a gate insulation layer; and a plurality of gate stacks formed on the gate insulation layer to overlap with the stepped profile of the respective active regions and the protruded portion of the relevant recess region.

Preferably, the first thickness of the first trench device isolation layers may be in a range from 2000 Å to 4000 Å, and the second thickness of the second trench device isolation layers may be one third of the first thickness of the first trench device isolation layers.

Preferably, the thickness of the protruded portion of the recess region may be substantially equal to the second thickness of the second trench device isolation layers.

Preferably, each of the gate stacks may have a stripe form, and may be formed to overlap with one of the second trench device isolation layers along with the stepped profile and the protruded portion of the relevant recess region.

In accordance with another aspect, the invention provides a method for manufacturing a transistor of a semiconductor memory device, including the steps of:

forming a hard mask layer pattern on a semiconductor substrate over a plurality of active regions;

forming a plurality of device isolation trenches in a device isolation region of the semiconductor substrate by using the hard mask layer pattern as an etching mask;

forming a trench device isolation layer by filling up the device isolation trenches with an insulation layer;

etching a part of the trench device isolation layer by a predetermined depth by use of a first mask layer pattern, to form a plurality of first and second trench device isolation layers arranged alternately with each other, the first trench device isolation layers having a first thickness corresponding to a relatively high step height, and the second trench device isolation layers having a second thickness corresponding to a relatively low step height;

removing the hard mask layer pattern;

etching the active regions by a predetermined depth by use of a second mask layer pattern, to form a recess region in each of the active regions, the recess region having a stepped profile at a boundary portion thereof and an upwardly protruded portion between adjacent two second trench device isolation layers;

forming a gate insulation layer; and forming a plurality of gate stacks on the gate insulation layer to overlap with the stepped profile of the respective active regions and the protruded portion of the relevant recess region.

Preferably, the hard mask layer pattern may include a pad oxide layer pattern having a thickness of 100 Å to 200 Å, and a pad nitride layer pattern having a thickness of 2000 Å to 800 Å, which are laminated in this sequence.

Preferably, the device isolation trenches may be formed to have a depth of 2000 Å to 4000 Å.

Preferably, the etching of the trench device isolation layer using the first mask layer pattern may be performed to remove two thirds of the entire thickness of the trench device isolation layer.

Preferably, the etching of each active region using the second mask layer pattern may be performed such that the resulting recess region has a depth equal to one third of the first thickness of the first trench device isolation layers.

Preferably, the formation of the gate stacks may be performed by use of the first mask layer pattern.

Preferably, each of the gate stacks may include a doped poly-silicon layer having a thickness of 400 Å to 700 Å, and a tungsten-silicide layer having a thickness of 1000 Å to 1500 Å.

BRIEF DESCRIPTION OF THE DRAWINGS

The invention will be more clearly understood from the following detailed description taken in conjunction with the accompanying drawings, in which.

DESCRIPTION OF THE PREFERRED EMBODIMENTS

A preferred embodiment of the invention will be explained in detail with reference to the accompanying drawings. The preferred embodiment of the invention may be modified into various different forms, and the scope of the invention is not intended to be limited by the following description of the preferred embodiment.

Figure 1:
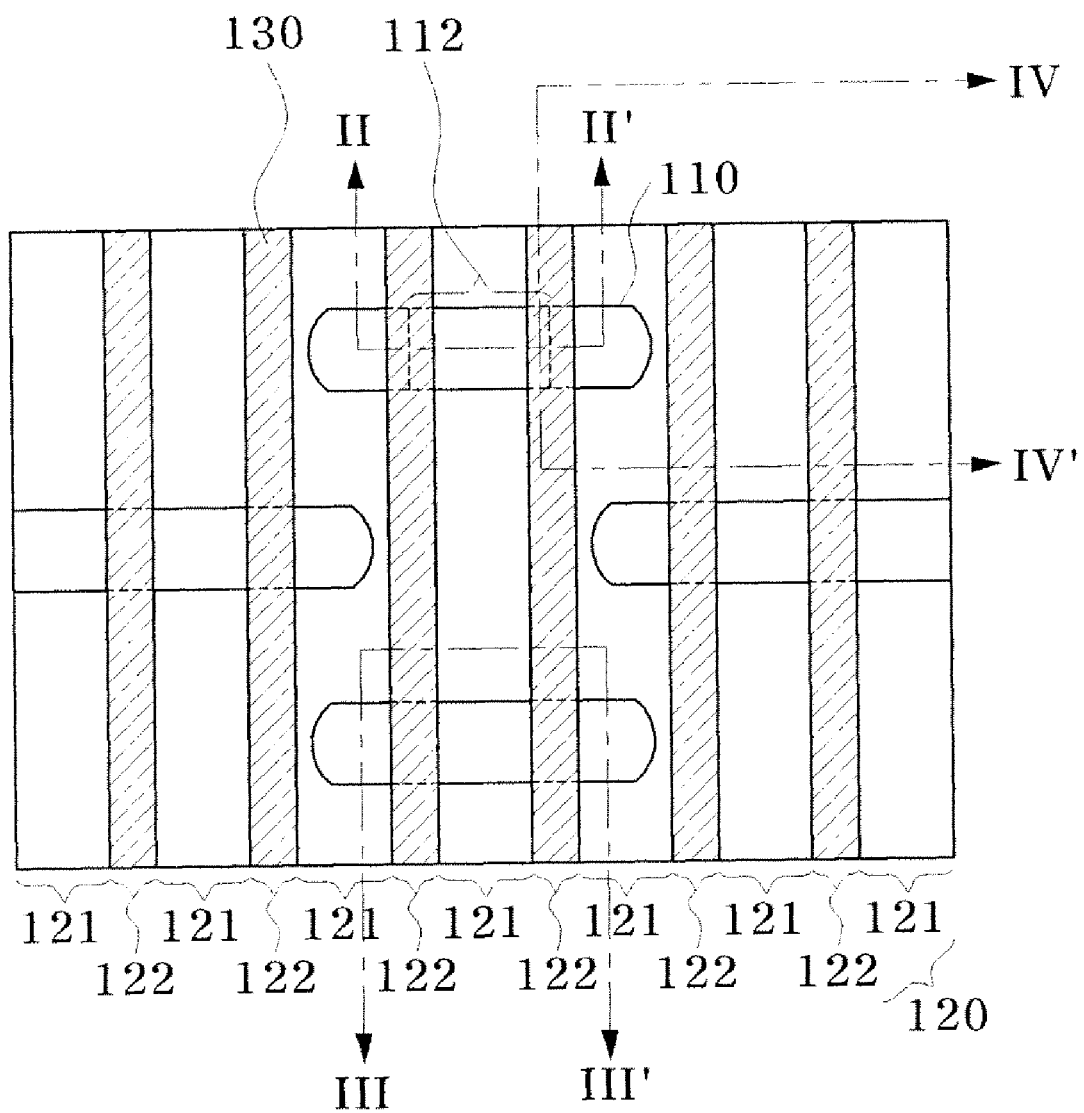
FIG. 1 is a layout diagram illustrating a transistor of a semiconductor memory device in accordance with the invention.
Figure 2:
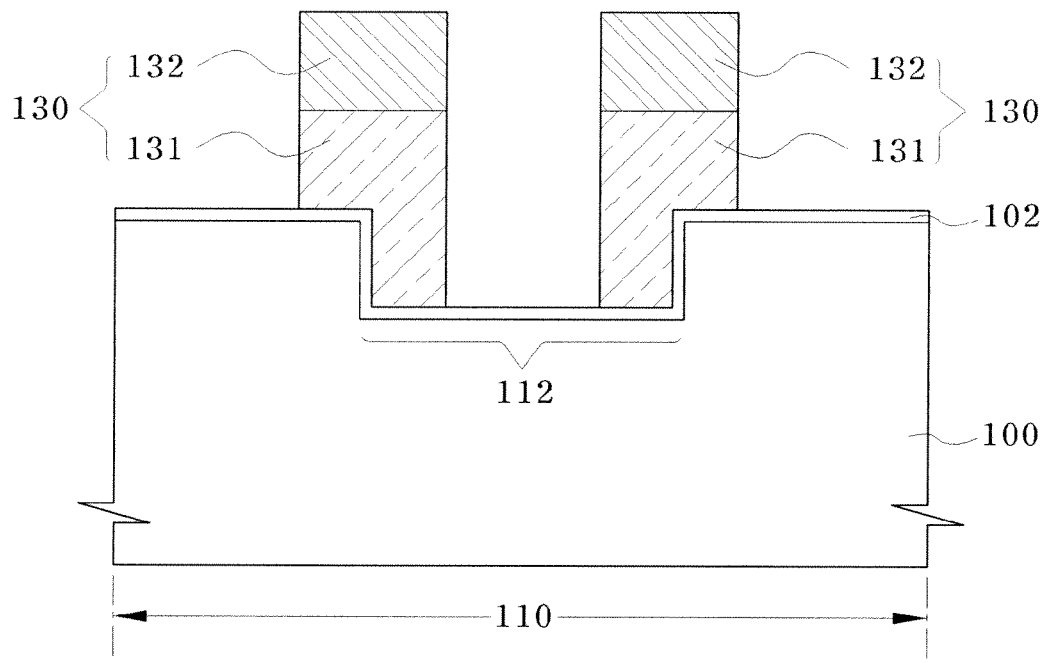
FIG. 2 is a sectional view taken along line II-II' of FIG. 1, illustrating the transistor of FIG. 1.
Figure 3:
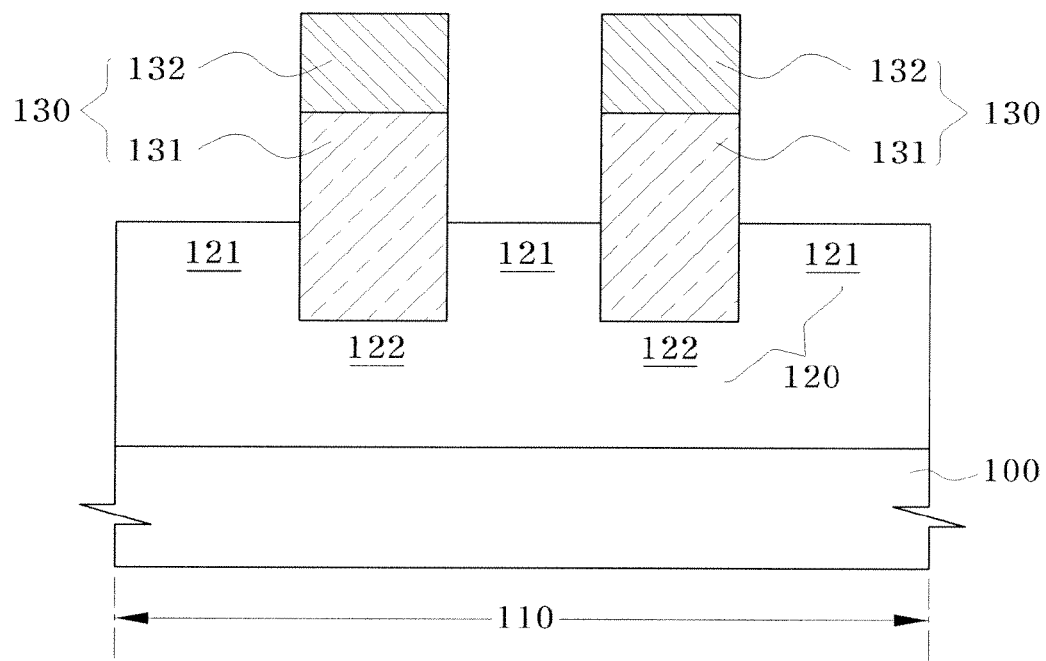
FIG. 3 is a sectional view taken along line III-III' of FIG. 1, illustrating the transistor of FIG. 1.
Figure 4:
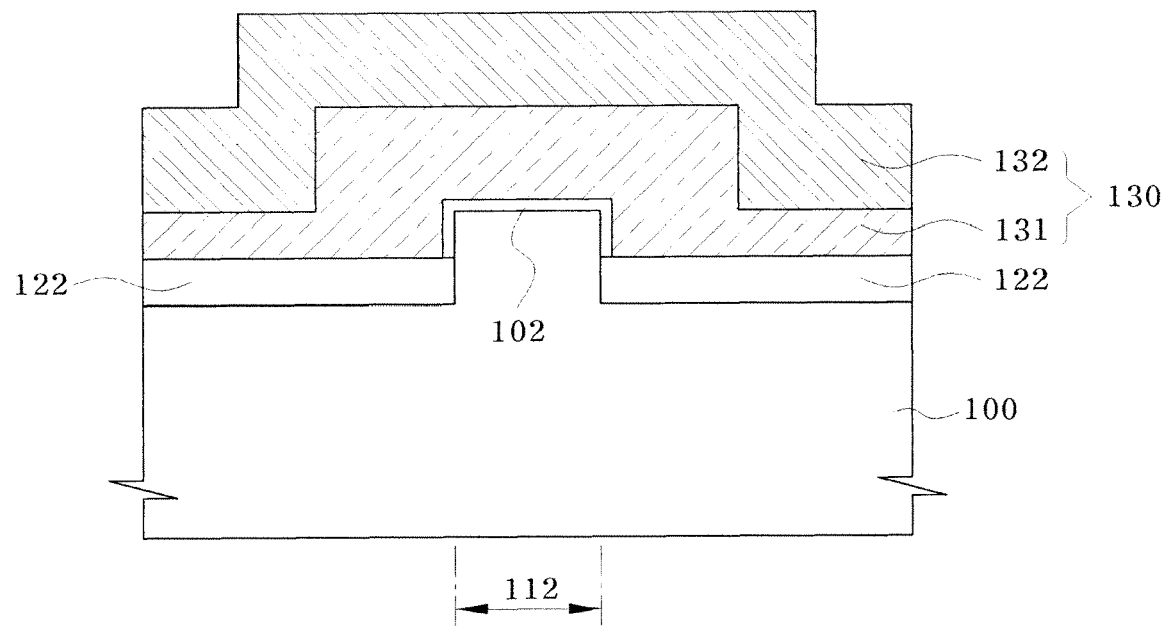
FIG. 4 is a sectional view taken along line IV-IV' of FIG. 1, illustrating the transistor of FIG. 1.

FIG. 1 is a layout diagram illustrating a transistor of a semiconductor memory device in accordance with the invention. FIGS. 2 to 4 are sectional views taken along lines II-II', III-III', and IV-IV' of FIG. 1, respectively, illustrating the transistor of FIG. 1.

Referring to FIGS. 1 to 4, a plurality of active regions 110 are defined by a device isolation layer 120 such that the active regions 110 are spaced apart from each other. In particular, the active regions 110 are alternately arranged such that the maximum number of active regions 110 is included in the minimum area. As shown in FIG. 2, each of the active regions 110 has a recess region 112, which is recessed in a central region of the active region 110 except for opposite edge regions. The height of an upper surface of the recess region 112 is lower than that of an upper surface of the relevant active region 110. Accordingly, a boundary portion of the recess region 112 has a stepped profile.

As shown in FIG. 3, the device isolation layer 120 includes a plurality of first device isolation layers 121 having a relatively high step height, and a plurality of second device isolation layers 122 having a relatively low step height. The thickness of the first device isolation layers 121 is in a range approximately from 2000 Å to 4000 Å, and the thickness of the second device isolation layers 122 is approximately one third of the thickness of the first device isolation layers 121. Also, an upper surface of the respective second device isolation layers 122 having the relatively low step height is located lower than the upper surface of the relevant active region 110. In particular, as shown in FIG. 4, the upper surface of the respective second device isolation layers 122 is located lower than the upper surface of the relevant recess region 112. The second device isolation layer 122 has a stripe form crossing the active region 110. In particular, the second device isolation layers 122 are arranged such that lateral surface of the stepped profile defined in each active region 110 is exposed to the outside by the second device isolation layers 122.

A gate insulation layer 102 is laminated on a semiconductor substrate over the active regions 110. The gate insulation layer 102 may be made of an oxide layer having a thickness of about 30 Å to about 50 Å, or may be made of an insulation material having a high dielectric constant, such as for example, alumina (Al2O3). Then, a plurality of gate stacks 130 are laminated on the gate insulation layer 102. Specifically, each of the gate stacks 130 is overlapped with the stepped profile of the relevant active region 110, and has a stripe form crossing the active region 110. The gate stack 130 includes a gate conductive layer pattern 131, and a hard mask layer pattern 132, which are laminated in this sequence. In turn, the gate conductive layer pattern 131 illustratively includes a polysilicon layer pattern having a thickness of about 400 Å to about 700 Å, and a tungsten-silicide layer pattern having a thickness of about 1000 Å to about 1500 Å, which are laminated in this sequence. Of course, other conductive layers may be used to form the gate conductive layer pattern 131. Also, the hard mask layer pattern 132 is illustratively formed of a nitride layer pattern.

The transistor having the above described configuration has a structure, which integrates the structure of a transistor having the stepped profile as shown in FIG. 2 and the structure of a fin field effect transistor as shown in FIG. 4. Accordingly, the transistor of the invention has improved operational characteristics, for example, high current drive ability and low back-bias dependency obtained by the structure of a fin field effect transistor, in addition to advantages of a transistor having a stepped profile.

Figure 5:
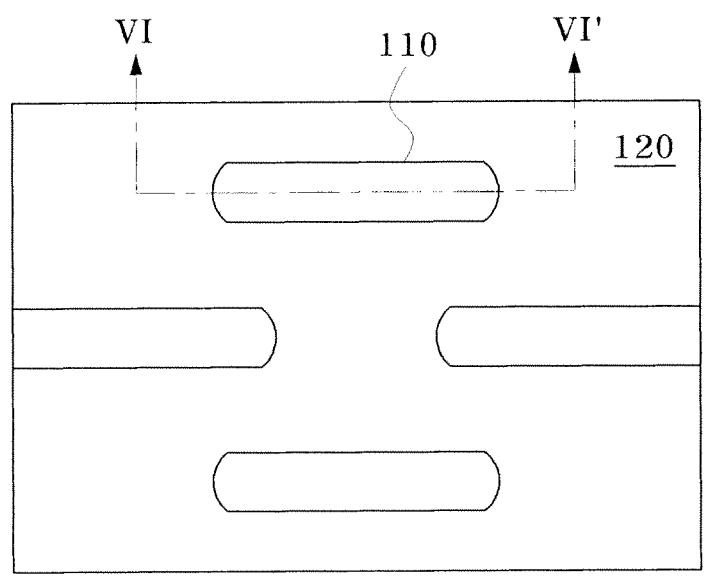
FIGS. 5 to 15 are views explaining a method for manufacturing a transistor of a semiconductor memory device in accordance with the invention.
Figure 6:
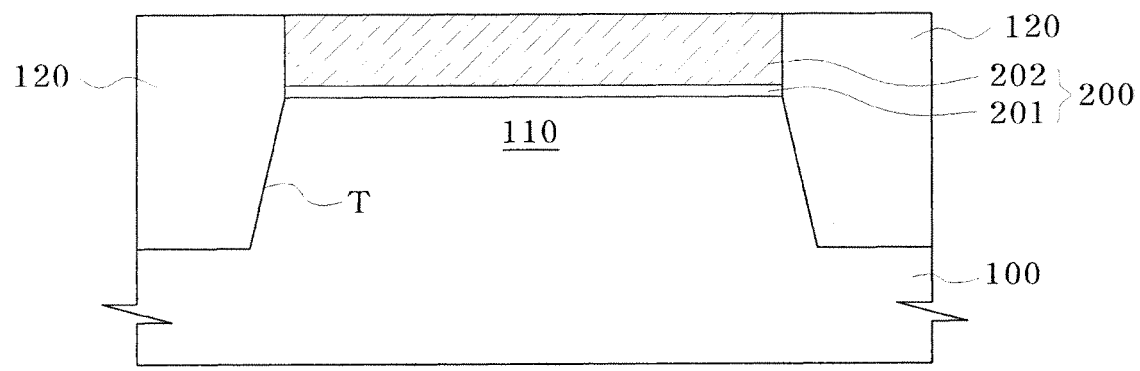
Figure 7:
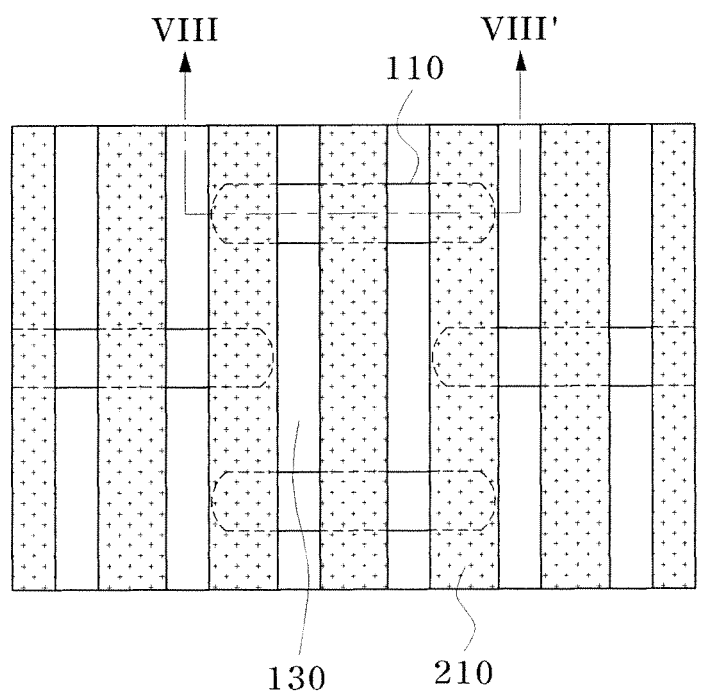
Figure 8:
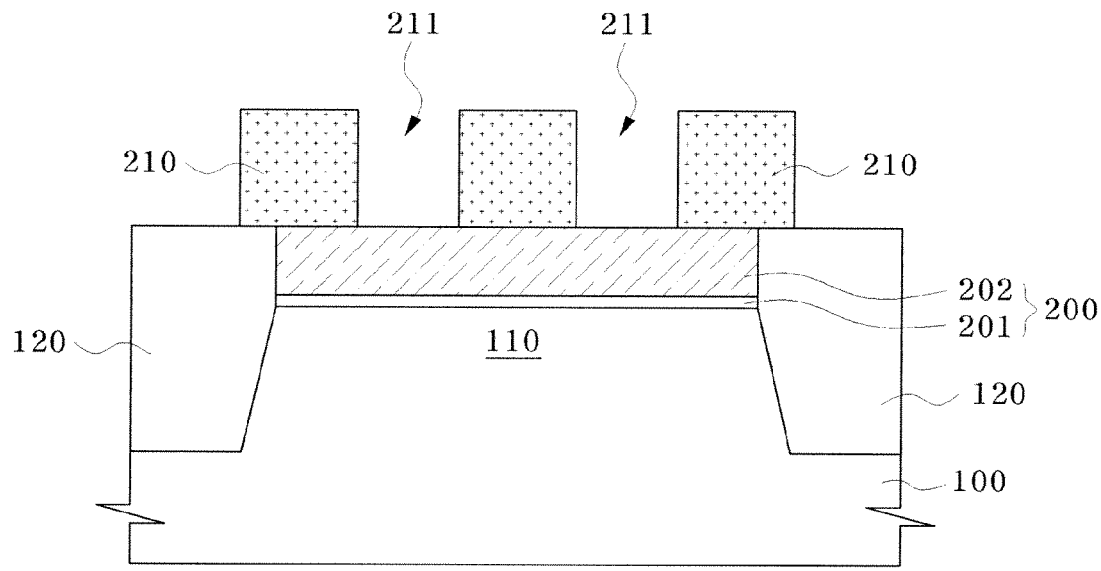
Figure 9:
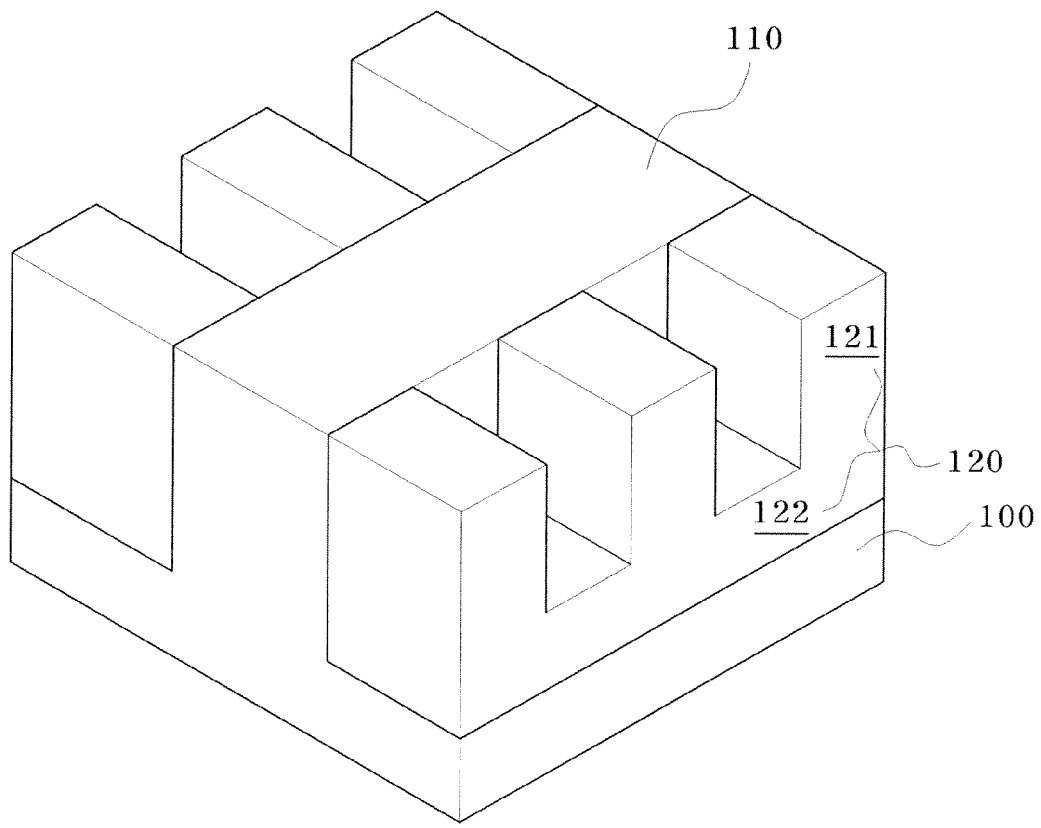
Figure 10:
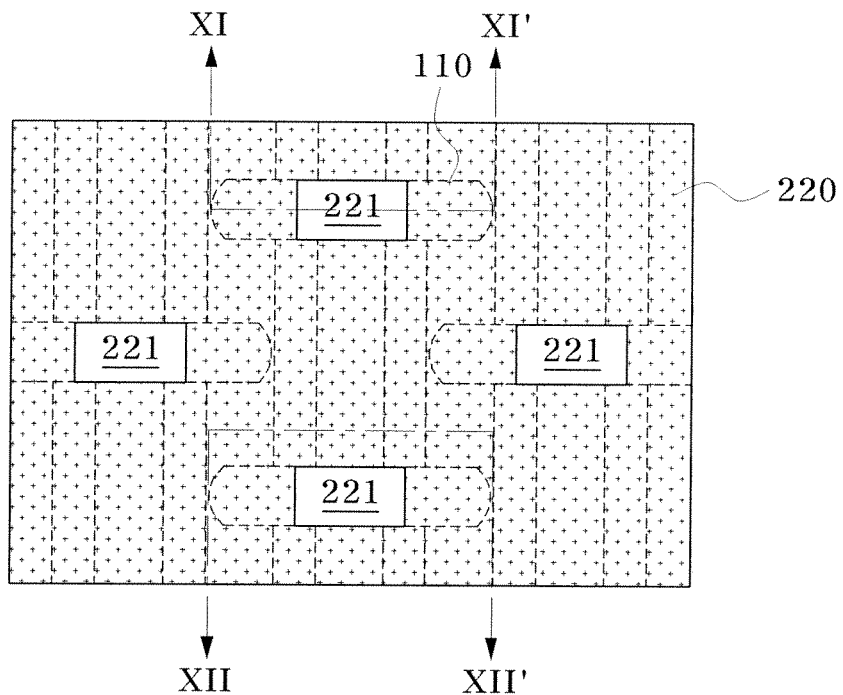
Figure 11:
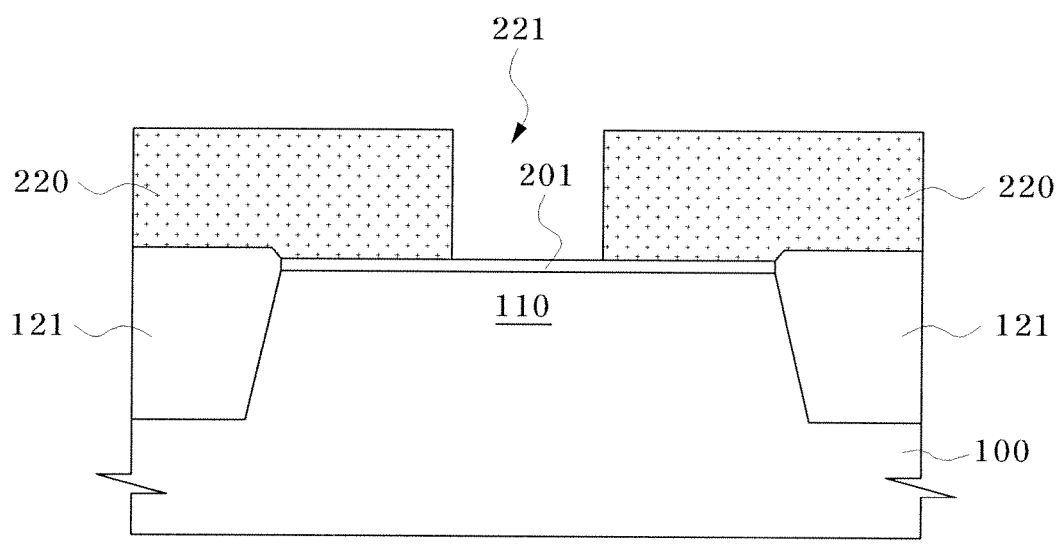
Figure 12:
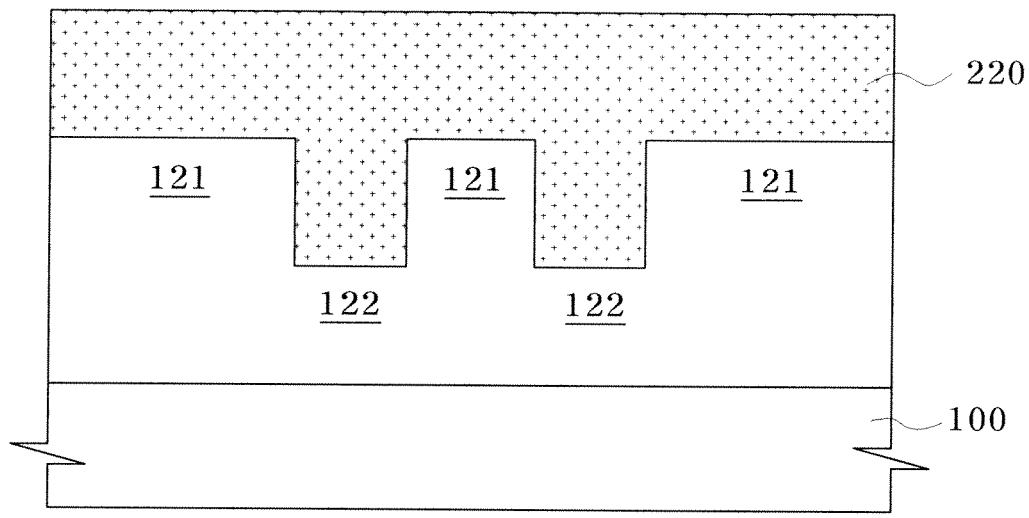
Figure 13:
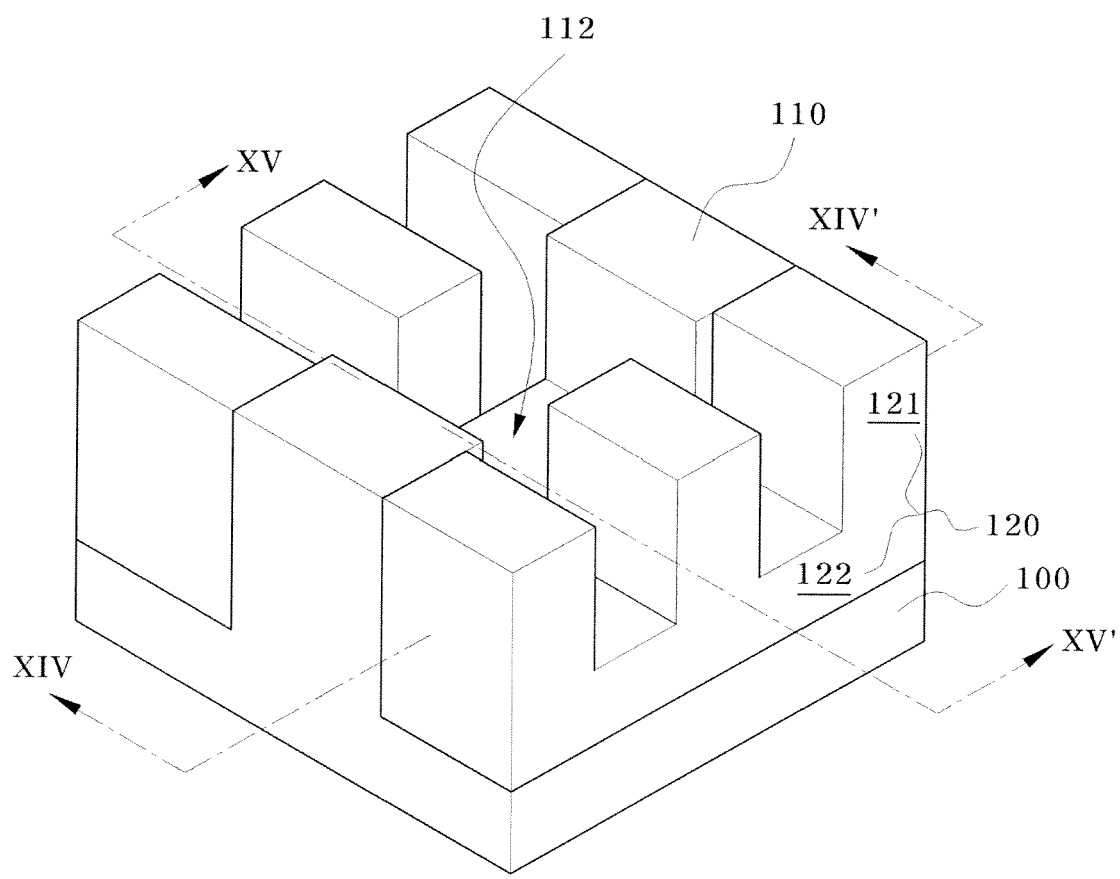
Figure 14:
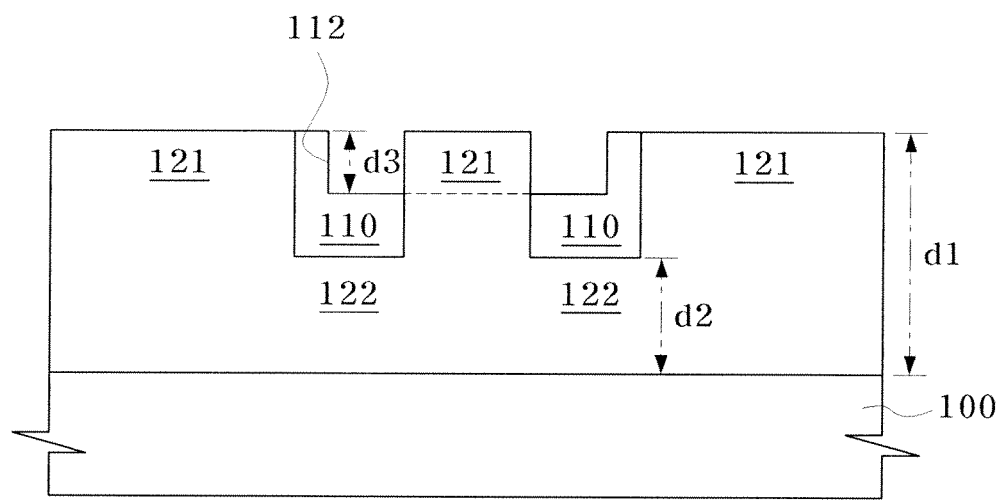
Figure 15:
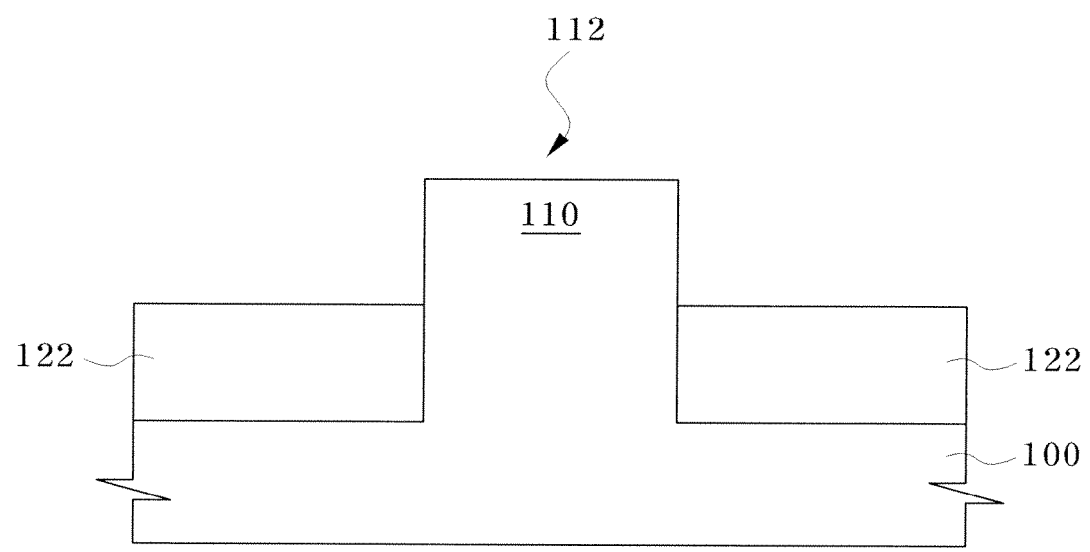

FIGS. 5 to 15 are views explaining a method for manufacturing a transistor of a semiconductor memory device in accordance with the invention. Here, FIG. 6 is a sectional view taken along line VI-IV' of FIG. 5, FIG. 8 is a sectional view taken along line VIII-VIII' of FIG. 7, FIGS. 11 and 12 are sectional views taken along lines XI-XI' and XII-XII' of FIG. 10, respectively, and FIGS. 14 and 15 are sectional views taken along lines XIV-XIV' and XV-XV' of FIG. 13, respectively.

Referring first to FIGS. 5 and 6, a hard mask layer is formed over the semiconductor substrate 100. The hard mask layer includes a pad oxide layer having a thickness of about 100 Å to about 200 Å, and a pad nitride layer having a thickness of about 500 Å to about 800 Å, which are laminated in this sequence. Then, a photoresist layer pattern (not shown) is formed over the hard mask layer. The photoresist layer pattern has a plurality of openings for exposing a surface of the hard mask layer at a device isolation region. In succession, the exposed surface portion of the hard mask layer is removed by using the photoresist layer pattern as an etching mask, to form a hard mask layer pattern 202. The hard mask layer pattern 200 serves to expose the device isolation region of the semiconductor substrate to the outside. The hard mask layer pattern 200 includes a pad oxide layer pattern 201, and a pad nitride layer pattern 202, which are laminated in this sequence.

Next, the photoresist layer pattern is removed, and the device isolation region of the semiconductor substrate is etched by using the hard mask layer pattern 200 as an etching mask, to form a plurality of device isolation trenches T. In this case, the etching depth of the device isolation region is, for example, in a range from about 2000 Å to about 4000 Å. After forming the device isolation trenches T, an insulation layer, for example, high density plasma (HDP) oxide layer, is laminated to fill up the trenches T. Then, a conventional flattening process is performed to expose an upper surface of the hard mask layer pattern 200, to form the trench device isolation layer 120 that defines the active regions 110.

Referring next to FIGS. 7 and 8, a first photoresist layer pattern 210 is formed on the entire surface of the resultant that is formed with the trench device isolation layer 120. The first photoresist layer pattern 210 has a stripe form crossing the active region 110 of the semiconductor substrate 100. Accordingly, each opening 211 (FIG. 8) of the first photoresist layer pattern 210 has a line form.

Referring to FIG. 9, an exposed portion of the trench device isolation layer 120 is removed to a predetermined depth by using the first photoresist layer pattern 210 as an etching mask. Although not shown in FIG. 9, the active regions 110 are covered by the hard mask layer pattern 200, and are not affected by etching. Therefore, only the exposed portion of the trench device isolation layer 120 is etched by a predetermined depth. The etching thickness of the trench device isolation layer 120 is approximately two thirds of the entire thickness of the trench device isolation layer 120. After completing the etching of the trench device isolation layer 120, the first photoresist layer pattern 210 is removed, and subsequently, the pad nitride layer 202 of the hard mask layer pattern 200 is removed. As a result, the resulting trench device isolation layer 120 includes a plurality of first trench device isolation layers 121 having the original thickness of the trench device isolation layer 120, and a plurality of second trench device isolation layers 122 having a reduced thickness, which is obtained by removing the first trench device isolation layers 121 to a predetermined depth. The thickness of the second trench device isolation layers 122 is approximately one third of that of the first trench device isolation layers 121.

Referring to FIGS. 10 to 12, a second photoresist layer pattern 220 is formed on the entire surface of the resultant. The second photoresist layer pattern 220 (FIG. 11) has a plurality of openings 221 (FIG. 10) to expose a part of the pad oxide layer pattern 201 located at the active regions 110. The photoresist layer pattern 220 is configured to cover the entire device isolation region where the first trench device isolation layers 121 and the second trench device isolation layers 122 are located.

Referring to FIGS. 13 to 15, the pad oxide layer pattern 201 and the semiconductor substrate 100 are etched by a predetermined depth by using the photoresist layer pattern 220 as an etching mask, to form the recess regions 112. In this case, the etching thickness is approximately one third of the entire thickness of the trench device isolation layer 120. Accordingly, the thickness of a lateral exposed portion of each active region 110 at the relevant recess region 112 (which is designated as reference alphanumeric character d3 of FIG. 14) is approximately one third of the thickness of the first trench device isolation layers 121 (which is designated as reference alphanumeric character d1 of FIG. 14), and also, is approximately equal to the thickness of the second trench device isolation layers 122 (which is designated as reference alphanumeric character d2 of FIG. 14). After completing the etching process, the second photoresist layer pattern 220 is removed. As a result, as shown in FIG. 14, when viewing from one side, either lateral surface of the active region 110 having a stepped profile is exposed to the outside by each second trench device isolation layer 122 between adjacent two first trench device isolation layers 121. Also, when viewing from the other side, as shown in FIG. 15, the upper surface of each recess region 112 between adjacent two second trench device isolation layers 122 has a protruded profile.

Then, a conventional gate stack forming process is performed. Specifically, a gate oxide layer, gate conductive layer, and hard mask layer are laminated in this sequence. The gate oxide layer has a thickness of about 30 Å to about 50 Å. The gate conductive layer includes a poly-silicon layer having a thickness of 400 Å to 700 Å, and a tungsten-silicide layer having a thickness of 100 Å to 1500 Å, which are laminated in this sequence. The hard mask layer may be formed of a nitride layer. In succession, a patterning process using a certain mask layer pattern is performed, whereby each of the gate stacks 130 is formed to overlap with the relevant stepped profile as shown in FIGS. 1 to 4. In this case, the patterning process may be performed by use of a mask that is used in the etching process for forming the second trench device isolation layers 122. As stated above, each of the gate stacks 130 includes the gate conductive layer pattern 131 and the hard mask layer pattern 132, which are laminated in this sequence.

As apparent from the above description, the invention provides a transistor of a semiconductor memory device having a structure, which integrates the structure of a transistor having a stepped profile and the structure of a fin field effect transistor. Therefore, in addition to advantages of the fin field effect transistor, for example, good On/Off characteristics, high current drive ability, and low back-bias dependency, the transistor can achieve an improvement in various characteristics, including a reduced source of current leakage with respect to bonding and an improved data retention time, by virtue of the structure of the transistor having a stepped profile.

Further, the invention provides a method for manufacturing a transistor of a semiconductor memory device, which can shield the entire region of a semiconductor substrate, except for a channel ion injection region, by use of a device isolation layer, thereby enabling local injection of channel ions within a limited region where a channel is formed. As a result, the channel can be formed without the risk of junction overlap, and thus, the quantity of leaked current can be reduced. Also, in accordance with the transistor manufacturing method of the invention, when a gate stack is formed, a thickness difference between a poly-silicon layer and a tungsten silicide layer, which are located between a bit line contact and a storage node contact, can be restricted. This has the effect of preventing the generation of gate leaning during a subsequent heat treatment.

Although the preferred embodiments of the invention have been disclosed for illustrative purposes, those skilled in the art will appreciate that various modifications, additions and substitutions are possible, without departing from the scope and spirit of the invention as recited in the accompanying claims.

What is claimed is:

1. A method for manufacturing a transistor of a semiconductor memory device, comprising:
   forming a hard mask layer pattern on a semiconductor substrate over a plurality of active regions;
   forming a plurality of device isolation trenches in a device isolation region of the semiconductor substrate by using the hard mask layer pattern as an etching mask;

forming a trench device isolation layer by filling up the device isolation trenches with an insulation layer;

etching a part of the trench device isolation layer by a predetermined depth by use of a first mask layer pattern, to form a plurality of first and second trench device isolation layers arranged alternately with each other, the first trench device isolation layers having a first thickness corresponding to a relatively high step height, and the second trench device isolation layers having a second thickness corresponding to a relatively low step height;

removing the hard mask layer pattern;

etching the active regions by a predetermined depth by use of a second mask layer pattern, to form a recess region in each of the active regions, the recess region having a stepped profile at a boundary portion thereof and a height higher than that of the second trench device isolation layers to form an upwardly protruded portion between two adjacent second trench device isolation layers; and forming a plurality gate insulation layers and plurality of gate stacks on the gate insulation layer to overlap with the stepped profile of the respective active regions and the protruded portion of the relevant recess region.

2. The method of claim 1, wherein the hard mask layer pattern includes a pad oxide layer pattern having a thickness of about 100 Å to about 200 Å, and a pad nitride layer pattern having a thickness of about 500 Å to about 800 Å, which are laminated in this sequence.

3. The method of claim 1, comprising forming the device isolation trenches to have a depth of about 2000 Å to about 4000 Å.

4. The method of claim 1, comprising etching the trench device isolation layer using the first mask layer pattern to remove about two thirds of the entire thickness of the trench device isolation layer.

5. The method of claim 1, comprising etching the each active region using the second mask layer pattern such that the resulting recess region has a depth equal to about one third of the first thickness of the first trench device isolation layers.

6. The method of claim 1, comprising forming the gate stacks by the first mask layer pattern.

7. The method of claim 1, wherein each of the gate stacks includes a doped polysilicon layer having a thickness of about 400 Å to about 700 Å, and a tungsten-silicide layer having a thickness of about 1000 Å to about 1500 Å.

* * * * *